(12) United States Patent
Dathe et al.

(10) Patent No.: US 8,525,583 B2
(45) Date of Patent: Sep. 3, 2013

(54) CIRCUIT, AN ADJUSTING METHOD, AND USE OF A CONTROL LOOP

(75) Inventors: Lutz Dathe, Dresden (DE); Matthias Vorwerk, Dresden (DE); Thomas Hanusch, Coswig (DE)

(73) Assignee: Atmel Corporation, San Jose, CA (US)

( * ) Notice: Subject to any disclaimer, the term of this patent is extended or adjusted under 35 U.S.C. 154(b) by 0 days.

(21) Appl. No.: 13/561,416

(22) Filed: Jul. 30, 2012

(65) Prior Publication Data

US 2012/0293246 A1   Nov. 22, 2012

Related U.S. Application Data

(63) Continuation of application No. 12/607,630, filed on Oct. 28, 2009, now Pat. No. 8,258,860.

(60) Provisional application No. 61/117,414, filed on Nov. 24, 2008.

(30) Foreign Application Priority Data

Oct. 28, 2008   (DE) .......................... 10 2008 053 535

(51) Int. Cl.
*G05F 1/10* (2006.01)

(52) U.S. Cl.
USPC ............................................ 327/544; 326/33

(58) Field of Classification Search
USPC ...................................... 327/544; 326/33, 34
See application file for complete search history.

(56) References Cited

U.S. PATENT DOCUMENTS

| | | | |
|---|---|---|---|
| 5,726,946 A | 3/1998 | Yamagata et al. | |
| 5,781,062 A | 7/1998 | Mashiko et al. | |
| 5,880,604 A | 3/1999 | Kawahara et al. | |
| 6,222,388 B1 | 4/2001 | Bridgewater, Jr. | |
| 6,384,674 B2 | 5/2002 | Tanizaki et al. | |
| 6,977,519 B2 | 12/2005 | Bhavnagarwala et al. | |
| 7,126,370 B2 | 10/2006 | Bhattacharya | |
| 7,134,028 B2 | 11/2006 | Bose et al. | |
| 7,157,932 B2 | 1/2007 | El-Kik et al. | |
| 7,219,244 B2 | 5/2007 | Kuang et al. | |
| 7,284,137 B2 * | 10/2007 | Clark et al. ................... | 713/300 |
| 7,400,123 B1 | 7/2008 | Voogel | |
| 7,453,311 B1 | 11/2008 | Hart et al. | |
| 7,492,215 B2 * | 2/2009 | Lee et al. ...................... | 327/544 |
| 7,508,697 B1 * | 3/2009 | Mukhopadhyay et al. ... | 365/154 |
| 7,551,019 B2 | 6/2009 | Fujita et al. | |
| 7,564,274 B2 | 7/2009 | Hughes | |
| 7,564,296 B2 | 7/2009 | Ito | |

(Continued)

OTHER PUBLICATIONS

Clark et al., "Reverse-Body Bias and Supply Collapse for Low Effective Standby Power", IEEE Transactions on VLSI Systems, vol. 12, No. 9, Sep. 2004, pp. 947-956.

Agarwal et al., "Power Gating with Multiple Sleep Modes", Proceedings of the 7th International symposium on quality Electronic Design, ISBN: 0-7695-2523-7, 2006.

(Continued)

*Primary Examiner* — Thomas J Hiltunen
(74) *Attorney, Agent, or Firm* — Baker Botts LLP

(57) ABSTRACT

A circuit, an adjusting method, and use of a control loop for adjusting a data retention voltage and/or a leakage current of a CMOS circuit for a sleep mode, wherein the CMOS circuit is operated to control in a measuring mode, whereby in the measuring mode a leakage current exclusively flows through the CMOS circuit, the control loop in the measuring mode adjusts the data retention voltage and/or the leakage current, and the adjustments of the control loop for the sleep mode are stored.

20 Claims, 3 Drawing Sheets

(56) References Cited

U.S. PATENT DOCUMENTS

| | | | |
|---|---|---|---|
| 7,605,644 B2 | 10/2009 | Idgunji et al. | |
| 7,642,836 B2 | 1/2010 | Capian et al. | |
| 7,659,773 B2 | 2/2010 | Choi et al. | |
| 7,719,347 B2 | 5/2010 | Sugimoto | |
| 7,737,720 B2 | 6/2010 | Idgunji et al. | |
| 7,760,009 B2* | 7/2010 | Yang et al. | 327/534 |
| 7,812,631 B2 | 10/2010 | Kim et al. | |
| 7,825,720 B2* | 11/2010 | Ramaraju et al. | 327/543 |
| 8,059,482 B2* | 11/2011 | Russell et al. | 365/226 |
| 8,068,376 B1* | 11/2011 | Tran | 365/228 |
| 8,120,410 B2* | 2/2012 | Meijer et al. | 327/534 |
| 8,258,860 B2* | 9/2012 | Dathe et al. | 327/544 |
| 2006/0220676 A1 | 10/2006 | Kanazawa | |
| 2006/0220726 A1 | 10/2006 | Ward et al. | |
| 2008/0143423 A1 | 6/2008 | Komatsu et al. | |
| 2008/0284465 A1 | 11/2008 | Kao | |
| 2010/0109764 A1 | 5/2010 | Dathe et al. | |
| 2012/0026805 A1* | 2/2012 | Tang et al. | 365/189.07 |

OTHER PUBLICATIONS

*USPTO Formalities Letter—Notice to File Missing Parts*, U.S. Appl. No. 12/607,630, filed Oct. 28, 2009, Inventor(s) L. Dathe et al., Nov. 17, 2009.

L. Dathe et al., U.S. Appl. No. 12/607,630, *Response to Pre-Exam Formalities*, Jan. 19, 2010.

*USPTO Non-Final Office Action*, U.S. Appl. No. 12/607,630, filed Oct. 28, 2009, Inventor(s) L. Dathe et al., Nov. 10, 2010.

L. Dathe et al., U.S. Appl. No. 12/607,630, *Amendment Response Pursuant to 37 C.F.R. §1.111*, Jan. 18, 2011.

*USPTO Final Office Action*, U.S. Appl. No. 12/607,630, filed Oct. 28, 2009, Inventor(s) L. Dathe et al., Apr. 8, 2011.

L. Dathe et al., U.S. Appl. No. 12/607,630, *Request for Continued Examination Amendment Response*, Oct. 4, 2011.

*USPTO Notice of Allowance and Fees Due*, U.S. Appl. No. 12/607,630, filed Oct. 28, 2009, Inventor(s) L. Dathe et al., Apr. 24, 2012.

\* cited by examiner

CIRCUIT, AN ADJUSTING METHOD, AND USE OF A CONTROL LOOP

RELATED APPLICATIONS

This nonprovisional application is a continuation of U.S. application Ser. No. 12/607,630, filed Oct. 28, 2009, now U.S. Pat. No. 8,258,860 and entitled "Circuit, An Adjusting Method, and Use of a Control Loop," which claims priority to U.S. Provisional Application Ser. No. 61/117,414, filed Nov. 24, 2008 and entitled "Circuit, An Adjusting Method, and Use of a Control Loop," which claims priority to German Patent Application No. DE 102008053535.4, filed Oct. 28, 2008 and entitled "Circuit, An Adjusting Method, and Use of a Control Loop."

BACKGROUND OF THE INVENTION

1. Field of the Invention

The present invention relates to a circuit, an adjusting method, and a use of a control loop.

2. Description of the Background Art

If a digital CMOS circuit is placed in a sleep mode, the gate capacitances of the CMOS circuit should no longer be recharged. The current consumption of the CMOS circuit is therefore significantly reduced in the sleep mode. Only a leakage current flows in the sleep mode, when the supply voltage continues to be present in the CMOS circuit in the sleep mode.

SUMMARY OF THE INVENTION

The object of the invention is to improve a circuit as much as possible.

Accordingly, a circuit is provided that can be integrated monolithically on a semiconductor chip. The integrated circuit has a digital CMOS circuit with NMOS field-effect transistors and with PMOS field-effect transistors. NMOS field-effect transistors in this case are of the n-conducting type, whereas PMOS field-effect transistors are of the p-conducting type. In the digital CMOS circuit, the NMOS field-effect transistors and PMOS field-effect transistors are used as complementary types. In this case, in a basic logic function, such as, for example, a gate, each NMOS field-effect transistor is assigned at least one PMOS field-effect transistor and each PMOS field-effect transistor is assigned at least one NMOS field-effect transistor.

The circuit can have a first load device and a second load device. The first load device is connected to a first supply voltage and to the source terminals of the NMOS field-effect transistors of the digital CMOS circuit. The first supply voltage, for example, can be ground or a negative voltage. The second load device is connected to a second supply voltage and to the source terminals of the PMOS field-effect transistors of the digital CMOS circuit. The second supply voltage is preferably a positive supply voltage. A load device in this case is taken to mean a circuit component that represents a load for a current flowing through said component and causes a voltage drop across the load. Preferably, the load device has a current voltage characteristic, which is assigned to a linear or preferably nonlinear course. The first load device and the second load device are preferably connected in series to the source terminals of the CMOS circuit.

The circuit can have an evaluation circuit, which is formed to evaluate a first source voltage at the source terminals of the NMOS field-effect transistors and is connected to the source terminals of the NMOS field-effect transistors. The first source voltage can be applied at the source terminals of the NMOS field-effect transistors, for example, as a reference potential, such as ground.

The evaluation circuit can be formed to evaluate a second source voltage at the source terminals of the PMOS field-effect transistors and is connected to the source terminals of the PMOS field-effect transistors.

The evaluation circuit for the evaluation can have a measuring circuit with an analog-to-digital converter or a number of comparators. The measuring circuit advantageously has analog subcircuits, such as amplifiers or subtractors or the like for the evaluation. Preferably, the evaluation circuit has in addition an arithmetic logic unit, for example, a microcontroller core.

The evaluation circuit can be formed for adjusting a first voltage drop across the first load device and for the adjustment is connected to a first control input of the first load device. The first control input can be an analog control input for the continuous adjustment of the first voltage drop. Preferably, the first control input however is a digital control input, which enables the adjustment of the first voltage drop in steps. For the adjustment, the first voltage drop depends on a control signal at the first control input. In addition, the first voltage drop can depend on a leakage current through the digital CMOS circuit and/or on a temperature.

The evaluation circuit can be formed for adjusting a second voltage drop across the second load device and for the adjustment is connected to a second control input of the second load device. The second control input can be an analog control input for the continuous adjustment of the second voltage drop. Preferably, the second control input, however, is a digital control input, which enables the adjustment of the second voltage drop in steps. For the adjustment, the second voltage drop depends on a control signal at the second control input. In addition, the second voltage drop can depend on a leakage current through the digital CMOS circuit and/or on a temperature.

The object of the invention furthermore is to provide as improved an adjustment method as possible.

Accordingly, a method is provided for adjusting a data retention voltage, applied across a CMOS circuit, and/or a leakage current through the CMOS circuit for a sleep mode of the CMOS circuit.

In the method, a first source voltage applied at the source terminals of NMOS field-effect transistors of the CMOS circuit is evaluated. For the evaluation, advantageously a first voltage difference between a first supply voltage and the first source voltage is determined.

In the method, a second source voltage applied at the source terminals of PMOS field-effect transistors of the CMOS circuit is evaluated. For the evaluation, advantageously a second voltage difference between a second supply voltage and the second source voltage is determined.

In the method, a first voltage drop across a first load device, connected to the source terminals of the NMOS field-effect transistors, is adjusted as a function of the first source voltage and/or the second source voltage.

Alternatively or in combination, in the method, a second voltage drop of a second load device, connected to the source terminals of the PMOS field-effect transistors, is adjusted as a function of the first source voltage and/or the second source voltage.

The object of the invention furthermore is to provide a use of a control loop.

Accordingly, a use of a control loop is provided for adjusting a data retention voltage, applied across a CMOS circuit, and/or a leakage current through the CMOS circuit for a sleep mode. The control loop preferably has an evaluation circuit for evaluating a first source voltage, applied at the source terminals of NMOS field-effect transistors of the CMOS circuit, and/or for evaluating a second source voltage, applied at the source terminals of PMOS field-effect transistors of the CMOS circuit. Preferably, the control loop has a first adjustable load device connected to the source terminals of the NMOS field-effect transistors. Preferably, the control loop has a second adjustable load device connected to the source terminals of the PMOS field-effect transistors.

The CMOS circuit is operated for control in a measuring mode. In the measuring mode, a leakage current exclusively flows through the CMOS circuit.

The control loop in the measuring mode adjusts the data retention voltage and/or the leakage current. The adjustments of the control loop for the sleep mode are stored.

The refinements described hereinafter relate to the circuit, as well as to the use of the control loop and to the adjusting method. Methods features emerge from the functions of the circuit. Functional features of the circuit emerge from the corresponding methods steps.

In an embodiment, the circuit is formed for an operating mode and a sleep mode with a current consumption that is reduced compared with the operating mode. In this regard, multiple sleep modes and/or multiple operating modes may also be provided. In the operating mode, the digital CMOS circuit is formed to perform various operating functions. For example, in this case, the digital CMOS circuit performs calculations, writes information in the memory or the register, or reads the appropriate information out of memory cells. In the operating mode, a clock signal can be applied to the digital CMOS circuit. In contrast, the digital CMOS circuit preferably performs no operations in the sleep mode.

In an operating mode, at least one of the load devices can be controlled to a low-resistance state. In the low-resistance state, a voltage drop across the load device can be disregarded in regard to circuit function. For example, the control of the low-resistance state can be effected by a switching on of a switching transistor. Preferably, in the sleep mode, the load device can be controlled to a state with a higher resistance value compared with the operating mode. The load device, in this case, is controlled in such a way that a leakage current, flowing through the MOS field-effect transistors and through the load device in the sleep mode, produces a voltage drop across the load device. It is preferably provided that in the sleep mode all digital elements of the CMOS circuit, such as gates or memory elements and the like, have a defined state. A defined state of this type is a logic one or logic zero at the output of the respective element.

The body-source voltage can be produced in a sleep mode of the circuit. A leakage current, flowing through the CMOS circuit and through the (first and/or second) load device, causes a voltage drop at the load device. The voltage drop of the load device can be caused by the leakage current only. Because of the connections of the load device to the source terminals of the CMOS circuit, this voltage drop produces a body-source voltage at the source terminals and body terminals of the field-effect transistors of the CMOS circuit.

According to a first embodiment, it is provided that the evaluation circuit or the first load device can have a first memory for storing the adjustment for the first voltage drop. The memory, for example, is a register or a nonvolatile memory cell.

According to a second embodiment, which can also be combined with the first embodiment, it is provided that the evaluation circuit or the second load device has a second memory for storing the adjustment for the second voltage drop. The memory, for example, is a register or a nonvolatile memory cell.

In an embodiment, the evaluation circuit can have a device for measuring a temperature. For example, a temperature sensor element together with the CMOS circuit can be integrated monolithically on a semiconductor chip. The evaluation circuit can be formed to evaluate a measuring signal corresponding to the temperature. Advantageously, the evaluation circuit can be formed to adjust the first voltage drop and/or to adjust the second voltage drop as a function of the measurement. Preferably, the evaluation circuit can be formed to map the adjustment of the first load device and/or to map the adjustment of the second load device to a measured temperature. Advantageously, the evaluation circuit has a mapping table.

It is provided in an embodiment that the first load device has an adjustable load, which acts between the source terminals of the NMOS field-effect transistors and the first supply voltage. The acting load can be adjustable. Advantageously, the load is formed by a number of transistors. Multiple connectable NMOS field-effect transistors with a different geometry, particularly gate width and/or gate length, are providing for adjusting the acting load.

It is provided in another embodiment that the second load device can have an adjustable load, which acts between the source terminals of the PMOS field-effect transistors and the second supply voltage. The acting load is preferably formed by a number of transistors and is adjustable by connection or disconnection of individual transistors. The adjustment occurs preferably automatically by the evaluation circuit, advantageously by the running of an adjustment program.

In another embodiment, an adjustable load has a number of switchable resistors, which can be connected and disconnected by means of switching transistors. Alternatively, a variable (active) resistor in the form of a field-effect transistor may also be used as a switchable resistor. For example, its drain-source path can be varied between resistance values. In the sleep mode, the adjustable load acts in series to the source terminals of the digital CMOS circuit, so that a leakage current through the digital CMOS circuit causes a voltage drop across the adjustable load.

The body terminals of the NMOS field-effect transistors of the digital CMOS circuit are preferably connected directly to the first supply voltage (conductively). Accordingly, no component, particularly no component with a resistance, is provided between the body terminals of the NMOS field-effect transistors and the first supply voltage. This also applies preferably to the body terminals of the PMOS transistors of the digital CMOS circuit, which are connected directly to the second supply voltage.

In an embodiment, it is provided that for adjusting the data retention voltage and/or of the leakage current, a leakage current due to the PMOS field-effect transistors and a leakage current due to the NMOS field-effect transistors are made more similar by adjustment process steps. It is provided that the leakage current due to the PMOS field-effect transistors and leakage current due to the NMOS field-effect transistors are compared by a first voltage drop across the first load device and by a second voltage drop across the second load device. If transistors with known properties, such as a known characteristic, are used, they can be used for a quantitative differentiation between the leakage current due to the PMOS field-effect transistors and the leakage current due to the NMOS field-effect transistor. Knowing the temperature of the CMOS circuit is helpful in this case but not absolutely necessary. If a number of field-effect transistors connected as MOS diodes are used as the load device, a temperature effect is relatively small.

In an embodiment, it is provided that in a leakage current predominantly due to the PMOS field-effect transistors, the first load device can be adjusted to the lowest voltage drop. In a second embodiment variant, it is provided that in a leakage current predominantly due to the NMOS field-effect transistors, the second load device is adjusted to the lowest voltage drop. In a third embodiment variant, the first load device and the second load device are adjusted to a maximum and/or an average voltage drop. These embodiment variants can also be combined with one another, for example, as a function of temperature.

For the evaluation, preferably reset values are set for a first resistance value of the first load device and for a second resistance value of the second load device. In addition, the temperature can be measured by means of an electrical temperature sensing element. Using a mapping table, a higher resistance value for the first and/or second load device is mapped to a more rapid CMOS circuit and a low resistance value to a slower CMOS circuit preferably as a function of the measured temperature. Alternatively, this is also possible without the temperature evaluation. To measure the process variation, the circuit preferably has a ring oscillator. The speed of the CMOS circuit, or the maximum operating frequency of the CMOS circuit, can be determined by the ring oscillator. As a rule, more rapid CMOS circuits have a higher leakage current. In the case of a high leakage current, it should be reduced as much as possible, so that the voltage drop at the load device should be maximized. In addition, however, the opposite requirement should also be fulfilled that the voltage drop across the CMOS circuit does not fall below a minimum voltage (for example, of 0.8 V).

In another embodiment, it is provided that the first voltage drop across the first load device and/or the second voltage drop across the second load device are increased preferably in steps until the data retention voltage has achieved a predefined or predefinable minimum voltage range.

In another embodiment, it is provided that the source voltage at the PMOS field-effect transistors and/or the source voltage at the NMOS field-effect transistors are evaluated in a measuring mode. Advantageously, moreover, the temperature of the CMOS circuit is evaluated. The decision is made from the measurement results by an arithmetic logic unit whether the first voltage drop across the first load device has increased or decreased and/or whether the second voltage drop across the second load device has increased or decreased. Preferably, by a separate adjustment of the first voltage drop and of the second voltage drop, the leakage current sum of both leakage currents is minimized. Preferably, in this case, a characteristic of the load device is known. Preferably, the load device has a number of field-effect transistors with a known characteristic. Measuring the actual temperature is advantageous to be able to estimate the exponential leakage current behavior of the PMOS field-effect transistors and/or the NMOS field-effect transistors of the CMOS circuit.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
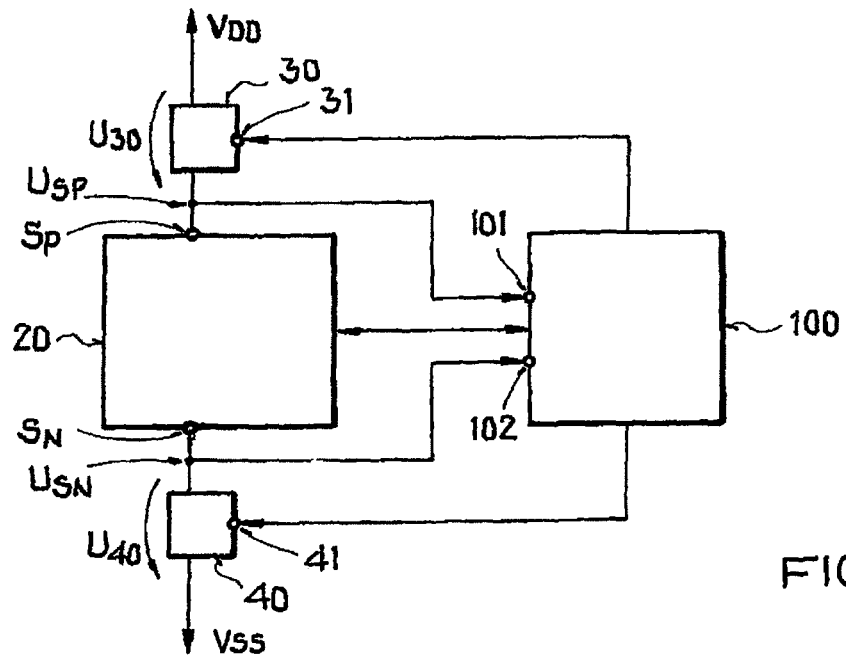
FIG. 1 shows a schematic block diagram of a circuit of an exemplary embodiment.

A first exemplary embodiment of a circuit is shown schematically in FIG. 1 by a block diagram. A CMOS circuit 20 with a plurality of NMOS field-effect transistors and a plurality of PMOS field-effect transistors is depicted schematically as a block. The source terminals $S_P$ of the PMOS field-effect transistors are connected to one another. The source terminals $S_N$ of the NMOS field-effect transistors are connected to one another.

A first load device 40 is connected to the source terminals $S_N$ of the NMOS field-effect transistors. First load device 40 is in turn connected to a first supply voltage VSS, for example, ground. A second load device 30 is connected to the source terminals $S_P$ of the PMOS field-effect transistors. Second load device 30 is in turn connected to a second supply voltage VDD, for example, a positive voltage relative to ground, for example, a battery. First load device 40, second load device 30, and digital CMOS circuit 20 are connected in series.

In an operating mode, an operating current flows through the series connection comprising first load device 40, second load device 30, and digital CMOS circuit 20. The operating current is determined by the CMOS circuit, particularly by the recharging of the gate capacitances of the NMOS field-effect transistors and PMOS field-effect transistors. In the operating mode, CMOS circuit 20 should operate as rapidly as possible, so that first load device 40 and second load device 30 are controlled to a low-resistance state by an evaluation circuit 100 connected to a first control input 41 of first load device 40 and to a second control input 31 of second load device 30. In the operating mode, therefore, a first voltage drop U40 across first load device 40 and a second voltage drop U30 across second load device 30 are small. In the operating mode, in addition, a data exchange between CMOS circuit 20 and evaluation circuit 100 is possible, which is indicated in FIG. 1 by a double arrow.

Figure 5:
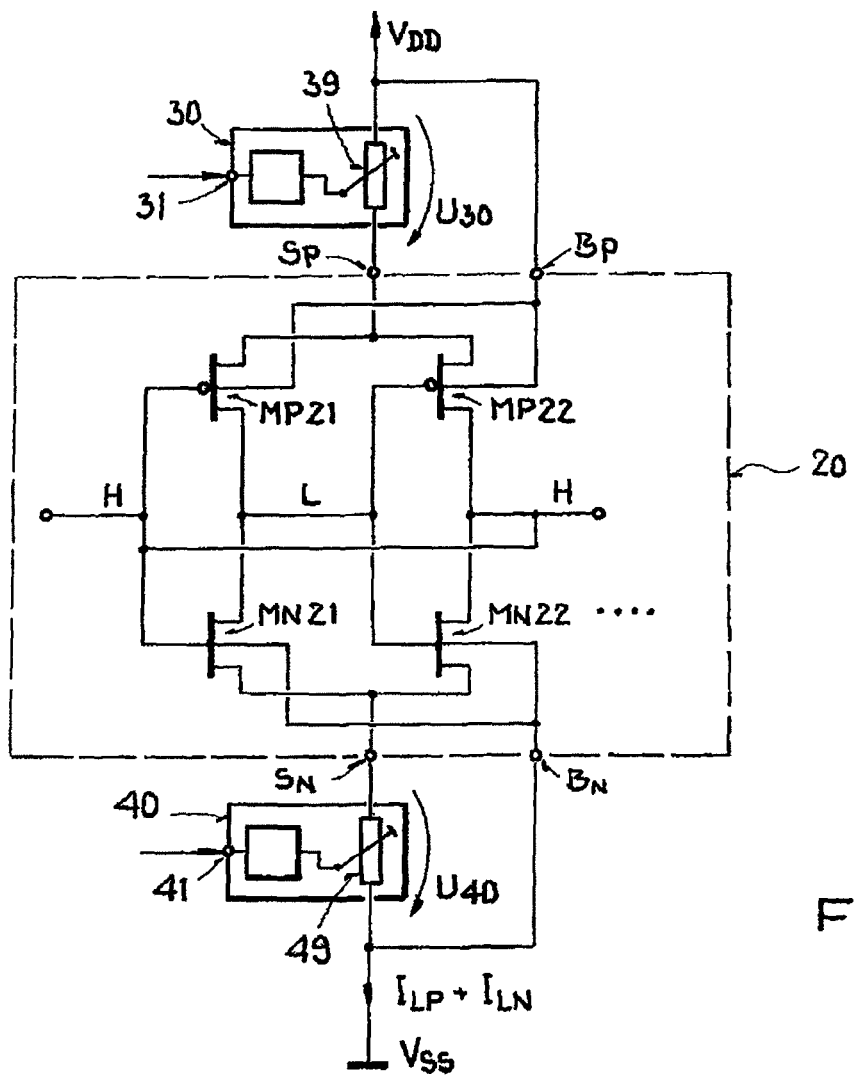
FIG. 5 shows a basic schematic circuit diagram to describe the mode of action.

In a sleep mode, a leakage current flows through the series connection comprising first load device 40, second load device 30, and digital CMOS circuit 20. FIG. 5 shows highly simplified a CMOS circuit 20 with two PMOS field-effect transistors MP21 and MP22 and two NMOS field-effect transistors MN21 and MN22.

The leakage current is caused partly by the blocking PMOS field-effect transistors MP21 and MP22 and partly by the blocking NMOS field-effect transistors MN21 and MN22. The value of the leakage current and the portions due to the NMOS and PMOS field-effect transistors MN21 and MN22, MP21 and MP22 in this case depend on the circuit, the logic states, and a manufacturing process for the NMOS and PMOS field-effect transistors MN21 and MN22, MP21 and MP22. Because of first load device 40, the source potential at the source terminals $S_N$ of the NMOS field-effect transistors MN21 and MN22 is increased compared with the body potential at the body terminals $B_N$. The body effect in this regard causes a reduction of the leakage current by means of the blocking NMOS field-effect transistors MN21 and MN22. This also applies to PMOS field-effect transistors MP21 and MP22. Because of second load device 30, the source potential at the source terminals $S_P$ of PMOS field-effect transistors MP21 and MP22 is increased compared with the body potential at the body terminals $B_P$. The body effect causes a reduction of the leakage current by means of the blocking PMOS field-effect transistors MP21 and MP22.

In the exemplary embodiment of FIG. 1, to reduce the leakage current, a voltage drop U40 across the first load device 40 can be adjusted by evaluation circuit 100. Accordingly, to reduce the leakage current, a voltage drop U30 across the second load device 30 can be adjusted by evaluation circuit 100. Evaluation circuit 100 and first load device 40 in this case can form a first control loop. Evaluation circuit 100 and second load device 30 in this case can form a second control loop. To this end, evaluation circuit 100 is connected to digital control inputs 41 and 31 of first load device 40 and second load device 30. Alternatively, analog control inputs 41 and 31 can also be provided, when as in the exemplary embodiment of FIG. 5 continuously adjustable load elements 49 or 39 are provided. In this case as well, a body-source voltage because of the body effect causes a reduction of the leakage current $I_{LP}$, or $I_{LN}$.

CMOS circuit 20 of the exemplary embodiment of FIG. 5 shows as an example of a memory element a latch with field-effect transistors MP21, MP22, MN21, and MN22. An H level would be present, for example, at the inputs of field-effect transistors MP21 and MN21. Therefore, an L level would be present at the inputs of field-effect transistors MP22 and MN22. In this example, transistors MN21 and MP22 are conductive, whereas transistors MN22 and MP21 block. The leakage current in this regard is the sum $I_{LP}+I_{LN}$ of the leakage current $I_{LP}$ through the blocking PMOS field-effect transistor MP21 and of the leakage current $I_{LN}$ through the blocking NMOS field-effect transistor MN22.

Digital circuit 20 and first load device 40 and second load device 30 are connected in series. In this case, the leakage current $I_{LP}+I_{LN}$ flows across first load device 40 and produces a first voltage drop U40 at first load device 40. The leakage current $I_{LP}+I_{LN}$ flows further through digital circuit 20 and finally through second load device 30 and there also produces correspondingly a second voltage drop U30. First voltage drop U40 and second voltage drop U30 may be different. First load device 40 and second load device 30 and memory elements MN21, MN22, MP21, and MP22 in this case must be formed in such a way that the available supply voltages VDD, VSS less the voltage drop U40 across first load device 40 and the voltage drop U30 across second load device 30 produce a sufficient holding voltage (VDD-U30-U40-VSS) across digital circuit 20, whereby the holding voltage (VDD-U30-U40-VSS) is sufficiently high so that memory elements MN21, MN22, MP21, and MP22 retain a defined state, therefore a logic one or a logic zero.

Figure 2:
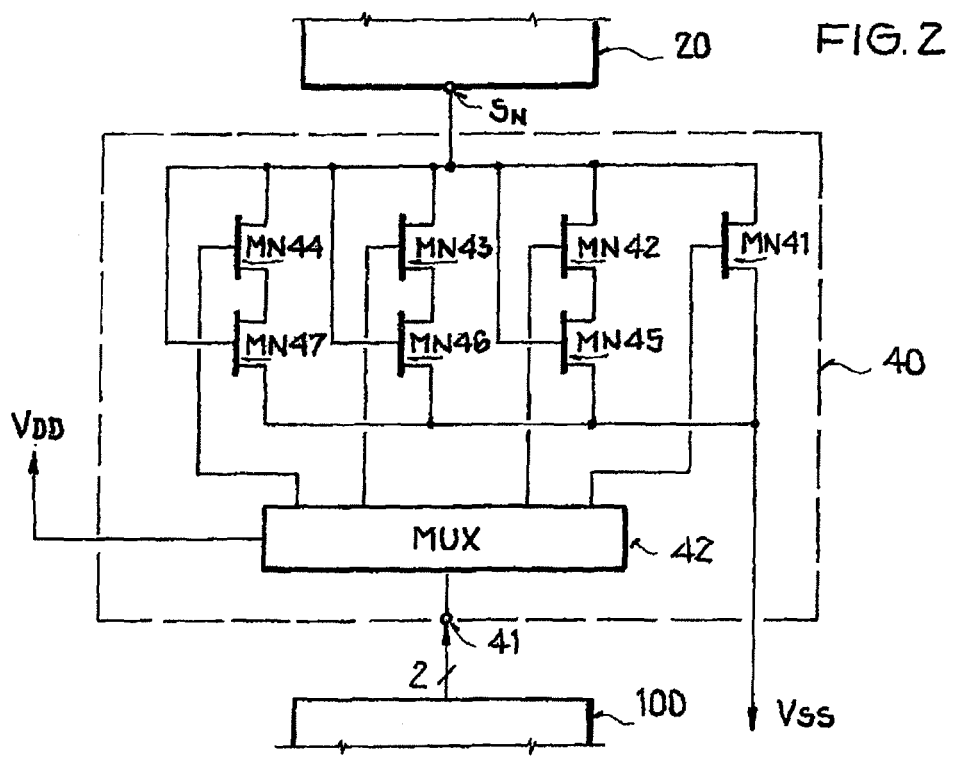
FIG. 2 shows a schematic illustration of a first load device of an exemplary embodiment.
Figure 3:
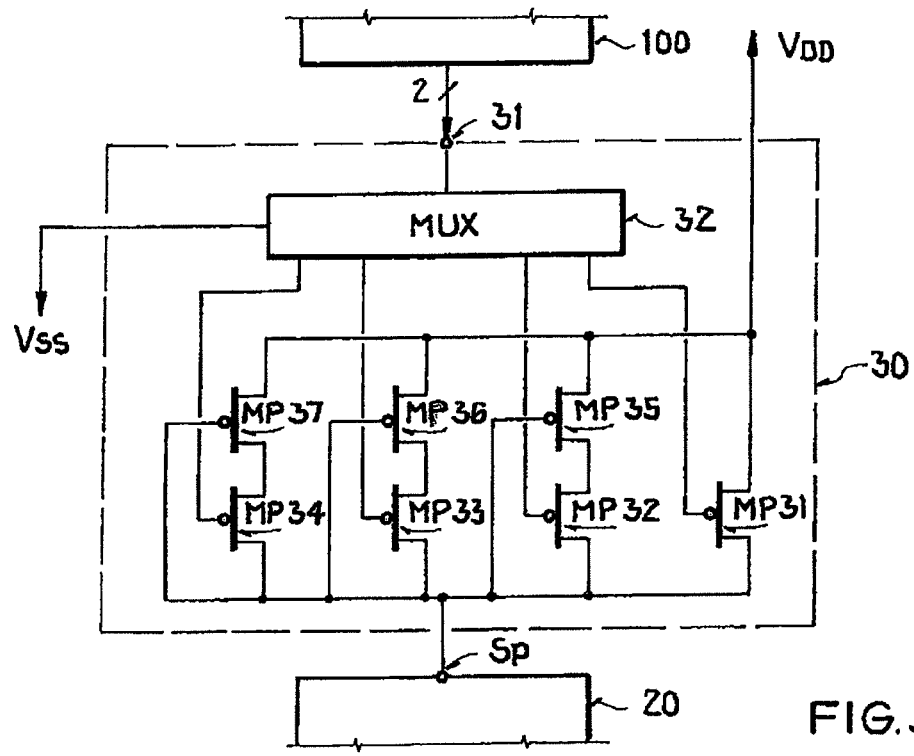
FIG. 3 shows a schematic illustration of a second load device of an exemplary embodiment.

An exemplary embodiment for a first load device 40 is shown in FIG. 2. FIG. 3 shows an exemplary embodiment for a second load device 30. First load device 40 has a digital control input 41, which is connected via a 2-bit-wide connection to the evaluation circuit. Evaluation circuit 100 via control input 41 can control a multiplexer 42, which connects the gate terminals of NMOS switching transistors MN41, MN42, MN43, and MN44 optionally to the positive supply voltage VDD for turning on. NMOS switching transistors MN41, MN42, MN43, and MN44 are all connected to the source terminals $S_N$ of the NMOS transistors of CMOS circuit 20. Load transistors MN45, MN46, and MN47 are NMOS field-effect transistors with different geometries (gate width, gate length), so that with the same drain current they cause different drain-source voltages and thereby differences in the first voltage drop U40. By means of transistors MN41 to MN47 and multiplexer 42, in the exemplary embodiment of FIG. 2, switching between a lowest resistance value, when transistor MN41 conducts, and three other resistance values of the transistors MN45, MN46, and MN47 can occur in steps as a function of the control of multiplexer 42.

This also applies to second load device 30 according to the exemplary embodiment of FIG. 3. Here, as well, a multiplexer 32 can be controlled by means of a digital signal at control input 31, which connects switching transistor MP31, MP32, MP33, and MP34 optionally to the first supply voltage potential VSS. Load transistors MP35, MP36, and MP37 are PMOS field-effect transistors with different geometries (gate width, gate length), so that they cause different drain-source voltages with the same drain current.

Figure 4:
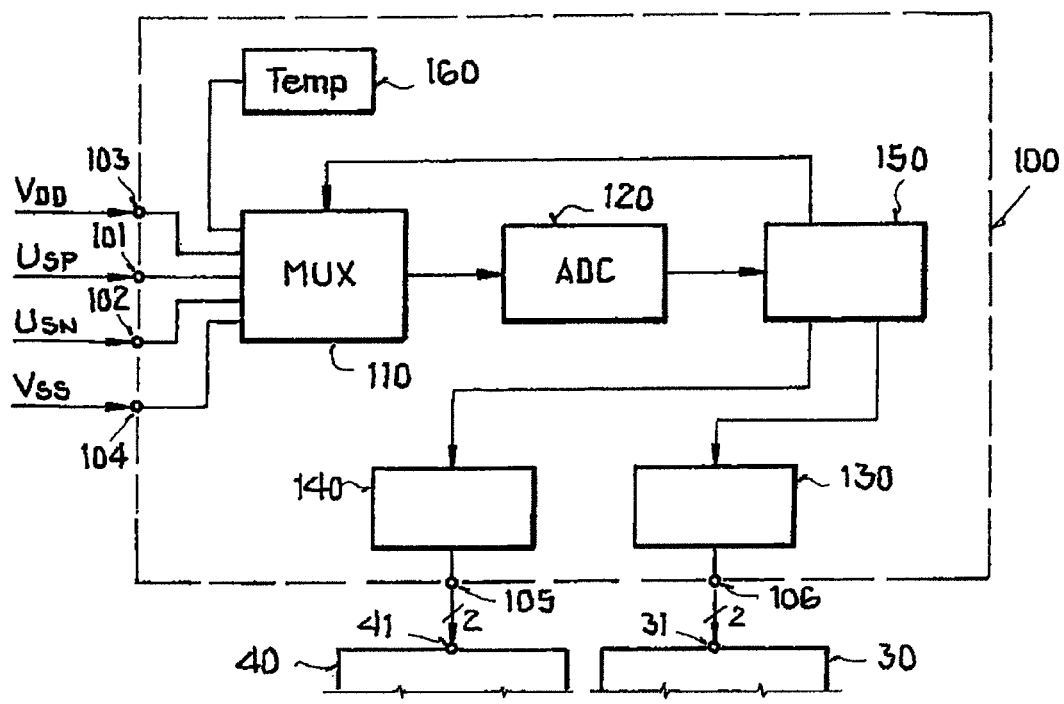
FIG. 4 shows a schematic illustration of an evaluation circuit of an exemplary embodiment.

An exemplary embodiment of an evaluation circuit 100 is shown schematically in FIG. 4. Evaluation circuit 100 has an arithmetic logic unit 150, which is formed, for example, as a core of a microcontroller. Furthermore, evaluation circuit 100 has an analog-to-digital converter 120, whose input signal can be switched by means of analog multiplexer 110 between a plurality of analog sources, such as analog inputs 101, 102, 103, 104, and sensors 160. For example, sensor 160 is a temperature sensor, such as a PIAT source [PTAT=proportional to absolute temperature], which together with CMOS circuit 20 is integrated monolithically on a semiconductor chip. Evaluation circuit 100 has memory elements 130, 140. For example, a first register 140 is connected to control input 41 of first load device 40 via digital control output 105 of evaluation circuit 100. For example, a second register 130 is connected to control input 31 of second load device 30 via digital control output 106 of evaluation circuit 100. Evaluation circuit 100 in the exemplary embodiment of FIG. 4 is formed to evaluate the first supply voltage VDD, the second supply voltage VSS, the source voltage $U_{SP}$ applied at the source terminals $S_P$ of the PMOS transistors, and the source voltage $U_{SN}$ applied at the source terminals $S_N$ of the NMOS transistors.

The invention is not limited to the shown embodiment variants in FIGS. 1 through 5. For example, it is possible to provide more or fewer transistors as the adjustable load in the load device in order to be able to adjust, for example, the body-source voltage in finer or coarser increments. The functionality of the circuit according to FIG. 1 can be used especially advantageously for a radio network, in particular according to the industry standard ZigBee.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A circuit comprising:
   a CMOS circuit having NMOS field-effect transistors and having PMOS field-effect transistors;

a first load device, wherein source terminals of the NMOS field-effect transistors of the CMOS circuit are connectable via the first load device to a first supply voltage;

a second load device, wherein source terminals of the PMOS field-effect transistors of the CMOS circuit are connectable via the second load device to a second supply voltage; and an evaluation circuit configured to:
- evaluate a first source voltage at the source terminals of the NMOS field-effect transistors;
- evaluate a second source voltage at the source terminals of the PMOS field-effect transistors;
- determine whether a leakage current through the CMOS circuit is predominantly due to the NMOS field-effect transistors or the PMOS field-effect transistors;
- adjust, when a determination is made that the leakage current is predominately due to the PMOS field-effect transistors, a first voltage drop across the first load device; and
- adjust, when a determination is made that the leakage current is predominately due to the NMOS field-effect transistors, a second voltage drop across the second load device.

2. The circuit of claim 1, wherein the circuit is configured to alternate between a sleep mode in which the leakage current flows through the CMOS circuit and an operating mode in which an operating current flows through the CMOS circuit, and wherein the operating current exceeds the leakage current.

3. The circuit of claim 1, wherein one or more of the following is true:
- the circuit has a first memory that is configured to store the adjustment of the first voltage drop; and
- the circuit has a second memory configured to store the adjustment of the second voltage drop.

4. The circuit of claim 1, wherein the first load device is configured to operate in a sleep mode in which the first voltage drop is generated via only a leakage current that flows through the CMOS circuit and the first load device.

5. The circuit of claim 1, wherein the second load device is configured to operate in a sleep mode in which the second voltage drop is generated via only a leakage current that flows through the CMOS circuit and the second load device.

6. The circuit of claim 1, wherein:
- the evaluation circuit has a device for measuring a condition; and
- the evaluation circuit is configured to perform one or more of the following:
  - adjust the first voltage drop to as a function of the measurement; and
  - adjust the second voltage drop as a function of the measurement.

7. The circuit of claim 6, wherein:
- the device comprises a temperature sensor; and
- the condition comprises a temperature.

8. The circuit of claim 1, wherein one or more of the following is true:
- the first load device has an adjustable load comprising a plurality of transistors that act between the source terminals of the NMOS field-effect transistors and the first supply voltage; and
- the second load device has an adjustable load comprising a plurality of transistors that act between the source terminals of the PMOS field-effect transistors and the second supply voltage.

9. The circuit of claim 1, wherein:
- the circuit, to adjust, when a determination is made that the leakage current is predominately due to the PMOS field-effect transistors, a first voltage drop across the first load device, is configured to adjust the first voltage drop across the first load device to the lowest voltage drop; and
- the circuit, to adjust, when a determination is made that the leakage current is predominately due to the NMOS field-effect transistors, a second voltage drop across the second load device, is configured to adjust the second voltage drop across the second load device to the lowest voltage drop.

10. A method comprising:
- determining a first source voltage applied at source terminals of NMOS field-effect transistors of a CMOS circuit;
- determining a second source voltage applied at source terminals of PMOS field-effect transistors of the CMOS circuit;
- determining whether a leakage current through the CMOS circuit is predominantly due to the NMOS field-effect transistors or the PMOS field-effect transistors;
- adjusting, when a determination is made that the leakage current is predominately due to the PMOS field-effect transistors, a first voltage drop across a first load device, the first load device being connected to the source terminals of the NMOS field-effect transistor; and
- adjusting, when a determination is made that the leakage current is predominately due to the NMOS field-effect transistors, a second voltage drop across a second load device, the second load device being connected to the source terminals of the PMOS field-effect transistor.

11. The method of claim 10, wherein:
- the first load device is directly connected to the source terminals of the NMOS field-effect transistor; and
- the second load device is directly connected to the source terminals of the PMOS field-effect transistor.

12. The method of claim 10, comprising alternating between a sleep mode in which the leakage current flows through the CMOS circuit and an operating mode in which an operating current flows through the CMOS circuit, and wherein the operating current exceeds the leakage current.

13. The method of claim 10, comprising one or more of the following:
- storing the adjustment of the first voltage drop; and
- storing the adjustment of the second voltage drop.

14. The method of claim 10, comprising operating the first load device in a sleep mode in which the first voltage drop is generated via only a leakage current that flows through the CMOS circuit and the first load device.

15. The method of claim 10, comprising operating the second load device in a sleep mode in which the second voltage drop is generated via only a leakage current that flows through the CMOS circuit and the second load device.

16. The method of claim 10, comprising:
- measuring a condition; and
- performing one or more of the following:
  - adjusting the first voltage drop as a function of the measurement; and
  - adjusting the second voltage drop as a function of the measurement.

17. The method of claim 16, wherein measuring the condition comprises measuring a temperature using a temperature sensor.

18. The method of claim 10, wherein one or more of the following is true:

the first load device has an adjustable load comprising a plurality of transistors that act between the source terminals of the NMOS field-effect transistors and the first supply voltage; and the second load device has an adjustable load comprising a plurality of transistors that act between the source terminals of the PMOS field-effect transistors and the second supply voltage.

19. The method of claim 10, wherein:

adjusting, when a determination is made that the leakage current is predominately due to the PMOS field-effect transistors, a first voltage drop across the first load device, comprises adjusting the first voltage drop across the first load device to the lowest voltage drop; and adjusting, when a determination is made that the leakage current is predominately due to the NMOS field-effect transistors, a second voltage drop across the second load device, comprises adjusting the second voltage drop across the second load device to the lowest voltage drop.

20. An apparatus, comprising:

means for determining a first source voltage applied at source terminals of NMOS field-effect transistors of a CMOS circuit;

means for determining a second source voltage applied at source terminals of PMOS field-effect transistors of the CMOS circuit;

means for determining whether a leakage current through the CMOS circuit is predominantly due to the NMOS field-effect transistors or the PMOS field-effect transistors;

means for adjusting, when a determination is made that the leakage current is predominately due to the PMOS field-effect transistors, a first voltage drop across a first load device, the first load device being connected to the source terminals of the NMOS field-effect transistor; and means for adjusting, when a determination is made that the leakage current is predominately due to the NMOS field-effect transistors, a second voltage drop across a second load device, the second load device being connected to the source terminals of the PMOS field-effect transistor.

* * * * *

UNITED STATES PATENT AND TRADEMARK OFFICE
CERTIFICATE OF CORRECTION

| | |
|---|---|
| PATENT NO. | : 8,525,583 B2 |
| APPLICATION NO. | : 13/561416 |
| DATED | : September 3, 2013 |
| INVENTOR(S) | : Lutz Dathe |

Page 1 of 1

It is certified that error appears in the above-identified patent and that said Letters Patent is hereby corrected as shown below:

In the Claims

Col. 9, Ln. 51, Claim 6: After "drop" and before "as" delete "to".

Signed and Sealed this
Fourteenth Day of October, 2014

Michelle K. Lee
*Deputy Director of the United States Patent and Trademark Office*